(12) United States Patent
Chen et al.

(10) Patent No.: US 8,378,480 B2
(45) Date of Patent: Feb. 19, 2013

(54) DUMMY WAFERS IN 3DIC PACKAGE ASSEMBLIES

(75) Inventors: Ming-Fa Chen, Taichung (TW); Chia-Yen Lee, Taoyuan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 12/717,779

(22) Filed: Mar. 4, 2010

(65) Prior Publication Data

US 2011/0215470 A1  Sep. 8, 2011

(51) Int. Cl.
*H01L 23/12* (2006.01)
*H01L 21/00* (2006.01)

(52) U.S. Cl. ........ 257/704; 257/774; 257/777; 438/109; 438/456

(58) Field of Classification Search .......... None
See application file for complete search history.

(56) References Cited

U.S. PATENT DOCUMENTS

| | | | |
|---|---|---|---|
| 4,323,914 A * | 4/1982 | Berndlmaier et al. | ........ 257/713 |
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,008,536 A * | 12/1999 | Mertol | ........................ 257/704 |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,891 B1 * | 10/2002 | Dishongh et al. | ............. 438/106 |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,882,043 B2 * | 4/2005 | Dishongh et al. | ............. 257/713 |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |

(Continued)

*Primary Examiner* — Alonzo Chambliss
(74) *Attorney, Agent, or Firm* — Slater & Matsil, L.L.P.

(57) ABSTRACT

A package structure includes a first die, and a second die over and bonded to the first die. The second die has a size smaller than a size of the first die. A dummy chip is over and bonded onto the first die. The dummy chip includes a portion encircling the second die. The dummy chip includes a material selected from the group consisting essentially of silicon and a metal.

11 Claims, 15 Drawing Sheets

U.S. PATENT DOCUMENTS

| | | |
|---|---|---|
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,772,691 B2 | 8/2010 | Lee et al. |
| 7,786,593 B2 * | 8/2010 | Ararao et al. ............ 257/777 |
| 7,834,450 B2 | 11/2010 | Kang |
| 2004/0018667 A1 * | 1/2004 | Joshi et al. ............ 438/126 |
| 2006/0163713 A1 * | 7/2006 | Tokunaga ............ 257/686 |
| 2007/0096294 A1 * | 5/2007 | Ikeda et al. ............ 257/704 |
| 2008/0128916 A1 * | 6/2008 | Soejima et al. ............ 257/777 |
| 2009/0311829 A1 | 12/2009 | Yang et al. |
| 2010/0102428 A1 * | 4/2010 | Lee et al. ............ 257/686 |

\* cited by examiner

DUMMY WAFERS IN 3DIC PACKAGE ASSEMBLIES

TECHNICAL FIELD

This disclosure relates generally to the packaging of integrated circuits, and more particularly to the packaging of three-dimensional integrated circuits (3DICs) using dummy wafers.

BACKGROUND

With the evolving of semiconductor technologies, semiconductor dies are becoming increasingly smaller and thinner. As a result, semiconductor packages are becoming more compact.

Package technologies can be divided into two categories. One category of packaging is referred to as chip-level packaging, in which dies are sawed from wafers before they are packaged. Advantageously, only "known-good-dies" are packaged. Another advantageous feature of this packaging technology is the possibility of forming fan-out chip packages, which means that the I/O pads on a die can be redistributed to a greater area than the die, and hence the number of I/O pads packed on the surfaces of the dies can be increased.

After dies are bonded to a wafer, the resulting structure, including the dies and the wafer, have an uneven surface due to the height of the dies and the gaps between the dies. This results in process difficulty in subsequent process steps, such as die sawing. Further, the wafer may be thin, and hence with the uneven surface and possible relative great thickness of the dies, the wafer is prone to breakage.

Molding compounds may be filled between the gaps of dies to planarize the surface of the resulting packaging structure. However, molding compounds typically have low thermal conductivities, and the resulting three-dimensional integrated circuits (3DICs) also have a low heat-dissipating capability. In addition, with the more compact 3DICs, more heat is generated in the 3DIC, making the heat dissipation a serious issue.

SUMMARY

In accordance with one aspect, a package structure includes a first die, and a second die over and bonded to the first die. The second die has a size smaller than a size of the first die. A dummy chip is over and bonded to the first die. The dummy chip includes a portion encircling the second die. The dummy chip includes a material selected from the group consisting essentially of silicon and a metal.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel package structure and the method of forming the same are presented. The intermediate stages of manufacturing an embodiment are illustrated. The variations of the embodiment are then discussed. Throughout the various views and illustrative embodiments, like reference numbers are used to designate like elements.

Figure 1:
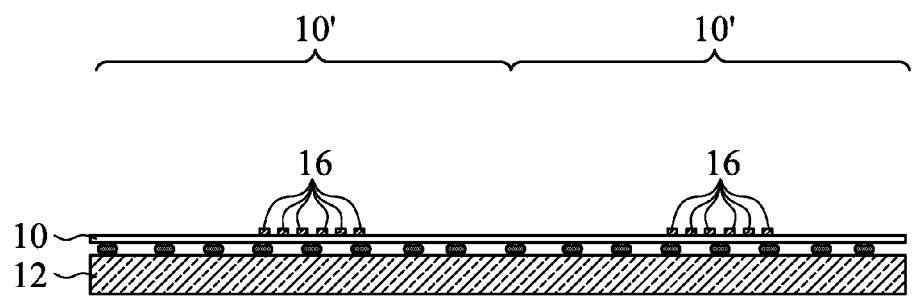
FIGS. 1 through 6B are cross-sectional views, a perspective view, and a top view of intermediate stages in the manufacturing of a package structure in accordance with an embodiment, wherein a dummy wafer is bonded to a bottom wafer after a die-to-wafer process is performed.

Referring to FIG. 1, bottom wafer 10 is mounted on carrier wafer 12. Bottom wafer 10 may include integrated circuits (not shown), such as complementary metal-oxide-semiconductor (CMOS) transistors, capacitors, resistors, and the like. Carrier wafer 12 may be a glass wafer, and bottom wafer 10 may be mounted onto carrier wafer 12 through an ultra-violet (UV) glue (not shown), for example. In alternative embodiments, carrier wafer 12 may be formed of other commonly used materials, such as organic materials, ceramics, or the like. Bottom wafer 10 comprises a plurality of bottom chips/dies 10' therein. Metal bumps 16, which may be copper bumps, solder bumps, or the like, are formed on the top side of bottom wafer 10.

Figure 2:
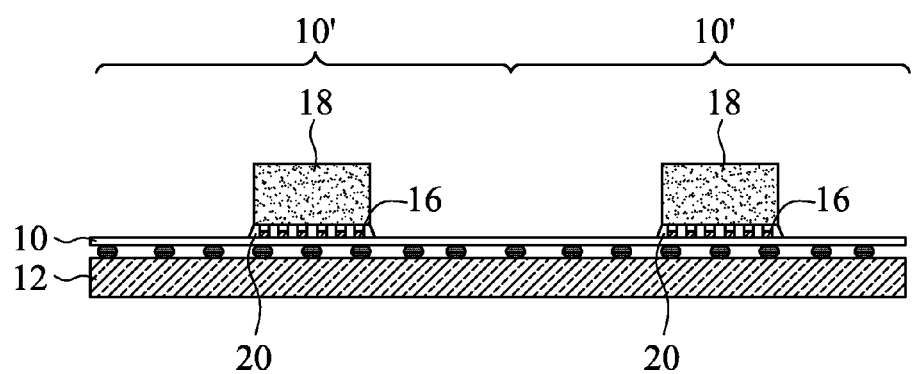
Figure 3A:
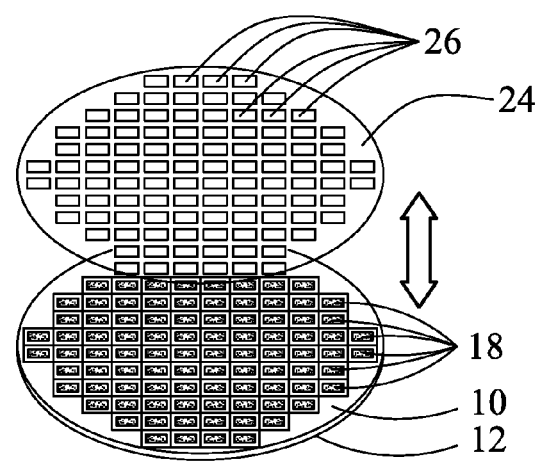

FIG. 2 illustrates the die-to-wafer bonding, in which top dies 18 are bonded onto bottom wafer 10, for example, through flip-chip bonding. Top dies 18 may be smaller in size than the respective bottom chips 10' in bottom wafer 10. Again, top dies 18 may include integrated circuits (not shown), such as CMOS transistors, therein. The bonding between top dies 18 and bottom wafer 10 may involve the reflow of solder bumps or direct copper-to-copper bonding, depending on the types of metal bumps 16 and/or the bumps on top dies 18. After the bonding process, underfill 20 may be filled into the gaps between top dies 18 and bottom wafer 10. In an embodiment, underfill 20 is cured before the process shown in FIG. 3A is performed. Alternatively, no curing process is performed before the process shown in FIG. 3A is performed, and underfill 20 is cured after dummy wafer 24 (not shown in FIG. 2, please refer to FIGS. 3A and 3B) is mounted onto bottom wafer 10.

Figure 3B:
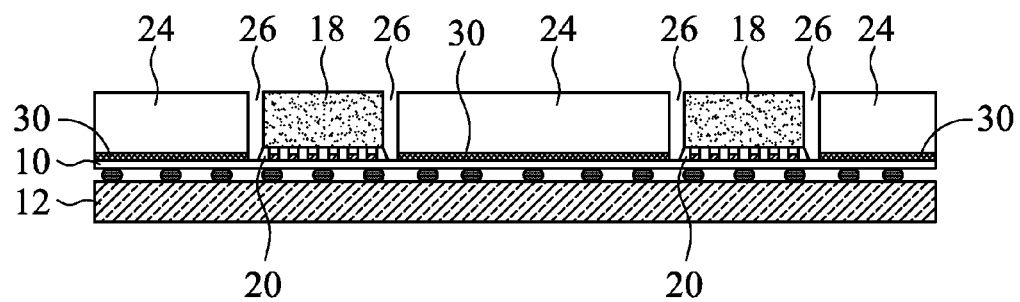

FIGS. 3A and 3B illustrate a perspective view and a cross-sectional view, respectively, of the bonding of dummy wafer 24 onto bottom wafer 10. Dummy wafer 24 may have a similar size and a similar shape as bottom wafer 10. Further, dummy wafer 24 includes a plurality of openings 26, each corresponding to one of top dies 18 in the size and the locations. Openings 26 may be through-openings that penetrate from one side of dummy wafer 24 to the opposite side. Dummy wafer 24 may have a good thermal conductivity, which may be greater than about 20 W/m-° C., for example. Alternatively, dummy wafer 24 has a thermal conductivity equal to or greater than the thermal conductivity of silicon. Dummy wafer 24 may be a silicon wafer, a metal wafer, or may be formed of any other thermally conductive materials. No active and/or passive integrated circuit devices, or substantially no active and/or passive integrated circuit devices (such as transistors, capacitors, resistors, and the like), are formed in dummy wafer 24. The bonding of dummy wafer 24 includes coating adhesive 30 (FIG. 3B) on a surface of dummy wafer 24, aligning openings 26 to top dies 18, and attaching dummy wafer 24 onto bottom wafer 10. A curing process may then be performed to cure adhesive 30. In the embodiment, underfill 20 was not cured in preceding process steps, it may also be cured simultaneously. Adhesive 30 may also have a good thermal conductivity, for example, greater than about 10 W/m-° C., or even greater than about 30 W/m-° C. Further, the thermal conductivity of adhesive 30 may be equal to or greater than that of silicon. Exemplary materials of adhesive 30 include a TIM material, indium, or the like. Referring to FIG. 3B, after dummy wafer 24 is mounted onto bottom wafer 10, top dies 18 extend into openings 26 and are exposed through openings 26.

Figure 4A:
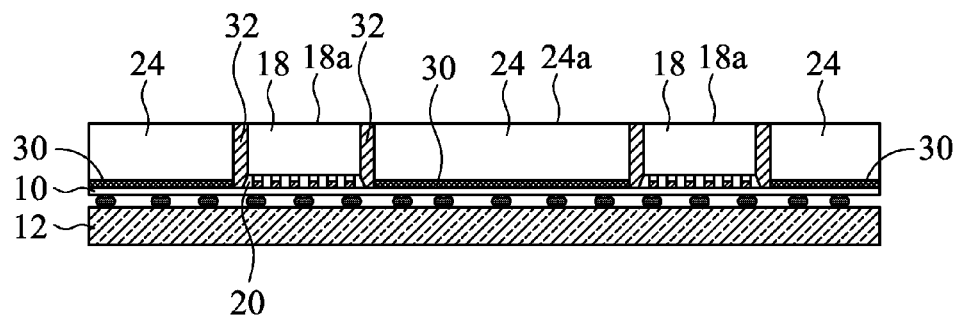
Figure 4B:
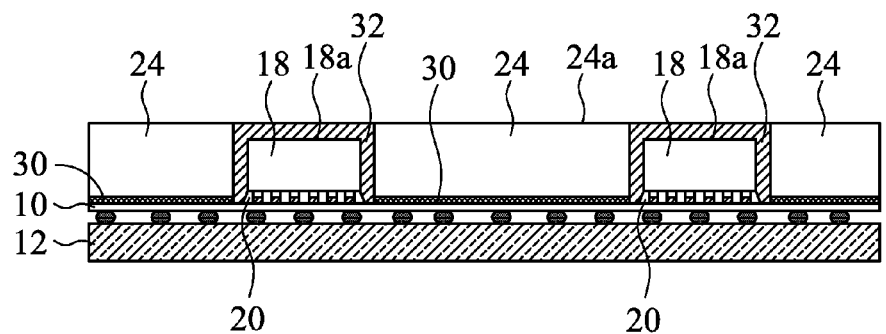

Next, as shown in FIG. 4A, thermally conductive material 32 with a good thermal conductivity, for example, greater than about 10 W/m-° C., is filled into the gaps between top dies 18 and dummy wafer 24 and is then cured. In an embodiment, as shown in FIG. 4A, back surfaces 18a of top dies 18 are substantially level with top surface 24a of dummy wafer 24. In alternative embodiments, as shown in FIG. 4B, back surfaces 18a of top dies 18 are lower than top surface 24a of dummy wafer 24. Accordingly, thermally conductive material 32 may be dispensed to the back surfaces of top dies 18, so that the resulting three-dimensional integrated circuit (3DIC) structure has a flat top surface.

Figure 5:
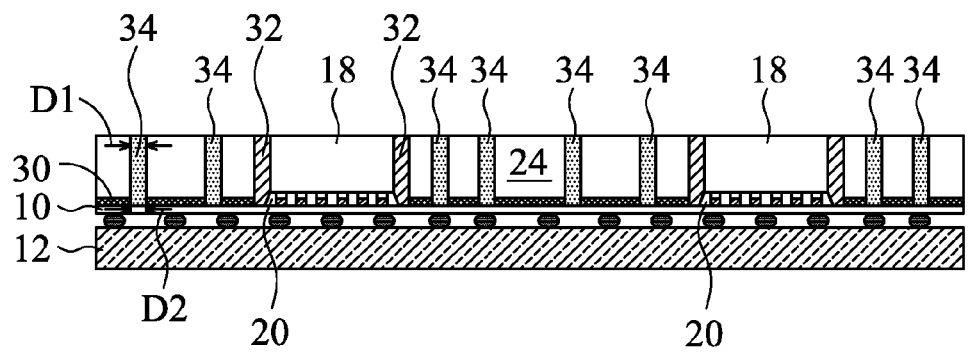

Referring to FIG. 5, in the embodiments wherein dummy wafer 24 is a dummy silicon wafer, metal pillars 34 may be optionally formed in dummy wafer 24. The formation of metal pillars 34 may include forming openings in dummy wafer 24, for example, by etching, and then filling the openings with a metallic material, such as copper, tungsten, aluminum, or the like. As a result of the etching process, the resulting metal pillars 34 may have a top diameter D1 greater than a bottom diameter D2. The formation of metal pillars 34 may be performed before or after dummy wafer 24 is bonded to bottom wafer 10. Metal pillars 34 may extend to the hot spots of bottom wafer 10, wherein the hot spots are where excess heat is generated during the usage of bottom die 10' (refer to FIG. 6A), which is sawed from bottom wafer 10. Alternatively, metal pillars 34 may be formed substantially uniformly in dummy wafer 24. Metal pillars 34 may extend to contact, but not penetrate, adhesive 30. Alternatively, metal pillars 34 may contact bottom wafer 10.

Figure 6A:
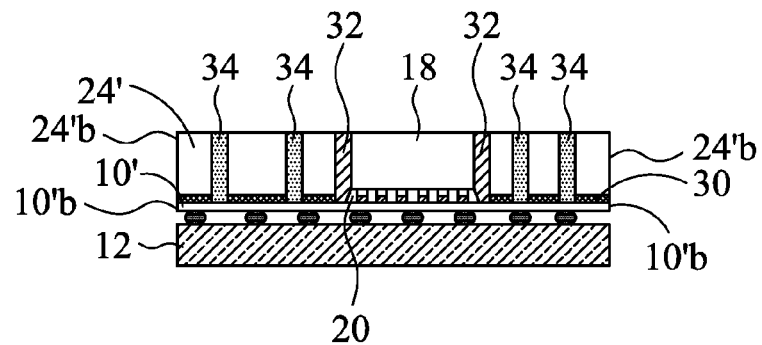
Figure 6B:
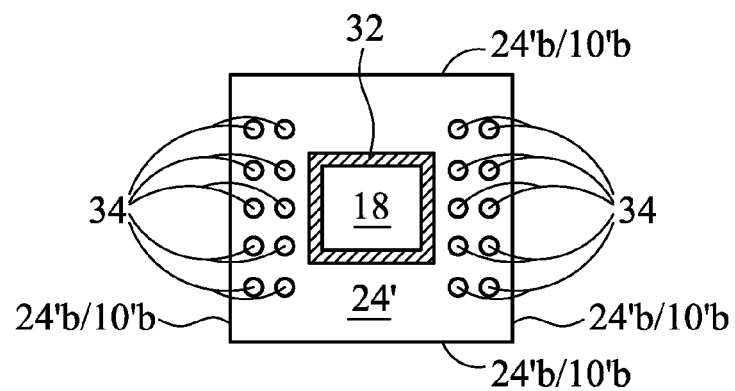

Carrier wafer 12 may then be demounted from bottom wafer 10, for example, by exposing the UV glue to a UV light. The resulting packaging structure, which is an integrated wafer that includes bottom wafer 10 and top dies 18, is then sawed into a plurality of dies. One of the resulting dies is illustrated in FIGS. 6A and 6B, which are a cross-sectional view and a top view, respectively. Each of the resulting dies includes bottom die 10' and top die 18. In a top view as shown in FIG. 6B, top die 18 is encircled by dummy chip 24', which is a portion separated from dummy wafer 24. Further, thermally conductive material 32 may also encircle top die 18. It is observed that outer edges 24'b of dummy chip 24' are vertically aligned to outer edges 10'b of bottom die 10'.

A heat sink (not shown) may also be attached to dummy chip 24', and either be in direct contact with metal pillars 34 and dummy chip 24', or thermally coupled to metal pillars 34, dummy chip 24', and top dies 18 through a thermal interface material (TIM) (not shown). Accordingly, the heat generated in bottom dies 10' may dissipate upward since metal pillars 34 and dummy chip 24' have high thermal conductivities. Accordingly, both bottom dies 10' and top dies 18 have heat dissipation paths that have high thermal conductivities.

Figure 7:
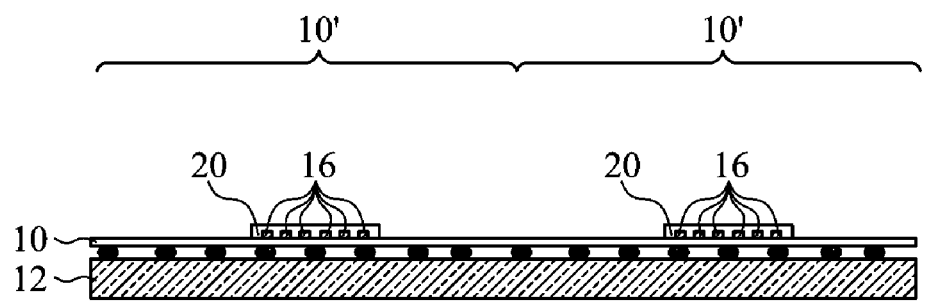
FIGS. 7 through 10 illustrate cross-sectional views of intermediate stages in the manufacturing of a package structure in accordance with an alternative embodiment, wherein top dies are bonded to a dummy wafer, and the resulting structure is bonded to a bottom wafer.
Figure 8:
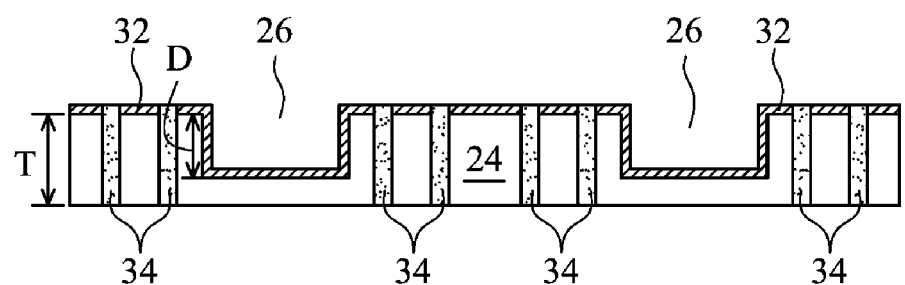
Figure 9:
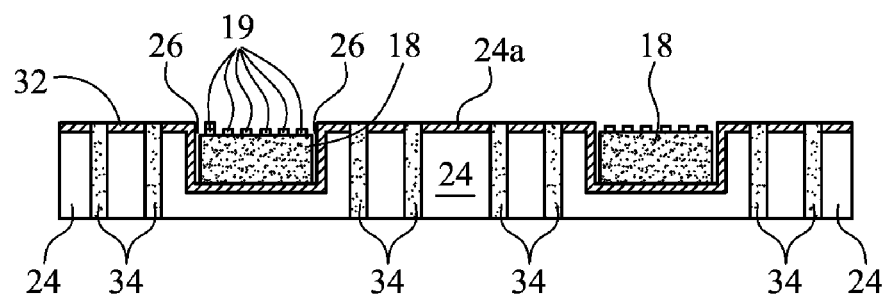

FIGS. 7 through 9 illustrate an alternative embodiment. Like elements in this embodiment and subsequent embodiments are denoted using like reference numerals as in the preceding embodiments, and the details of the respective materials and the processes may also be essentially the same as in the preceding embodiments, unless specified otherwise. Referring to FIG. 7, bottom wafer 10 is mounted onto carrier wafer 12, followed by the dispensing of underfill 20 to cover metal bumps 16.

Referring to FIG. 8, dummy wafer 24 is provided, in which a plurality of openings 26 are formed. Openings 26 only penetrate partially into dummy wafer 24. In other words, depth D of openings 26 is smaller than thickness T of dummy wafer 24. Depth D of openings 26 may be close to the thickness of subsequently bonded top dies 18 (not shown in FIG. 8, please refer to FIG. 9). Thermally conductive material 32, which may be an adhesive, is then coated onto dummy wafer 24.

Figure 10:
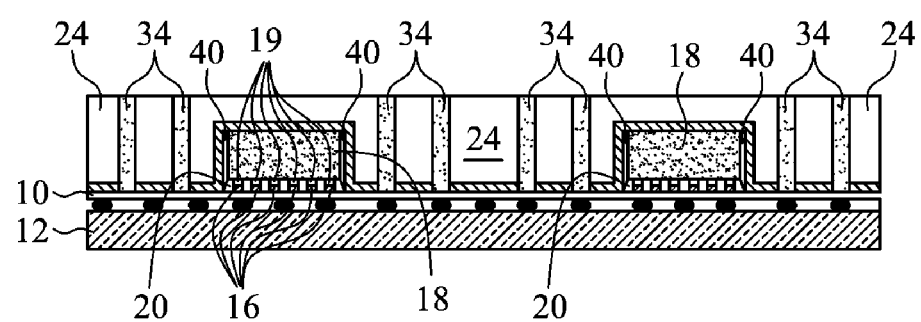

Next, as shown in FIG. 9, top dies 18 are placed and secured in openings 26 by thermally conductive material 32, with bumps 19 of top dies 18 being aligned to the positions of metal bumps 16 in bottom wafer 10 (refer to FIG. 7). After top dies 18 are secured, bumps 19 may be slightly higher than top surface 24a of dummy wafer 24. Referring to FIG. 10, top dies 18 and dummy wafer 24 are mounted onto bottom wafer 10. A pressure is applied so that bumps 19 penetrate through underfill 20 to contact metal bumps 16. A bonding process may then be performed to bond top dies 18 to bottom wafer 10, wherein the bonding process may include the reflow of solder bumps or a direct copper-to-copper bonding, depending on the types of metal bumps 16 and/or bumps 19. Further, a curing process may be performed to cure underfill 20 and thermally conductive material 32.

In the resulting structure, the gaps between top dies 18 and the sidewalls of openings 26 may be partially filled with underfill 20, which is squeezed into the gaps when dummy wafer 24 is mounted onto bottom wafer 10. However, gaps 40, which are unfilled parts of openings 26, may still remain unfilled.

In subsequent process steps, metal pillars 34 (refer to FIGS. 5, 6A, and 6B) may be optionally formed in dummy wafer 24 and extend to the hot spots of bottom wafer 24, followed by the removal of carrier wafer 12 and the sawing of the resulting package structure. A heat sink (not shown) may also be attached to dummy chip 24' in the resulting package structure. The details of the processes were discussed referring to FIGS. 5 and 6A, and hence are not repeated herein.

Figure 11:
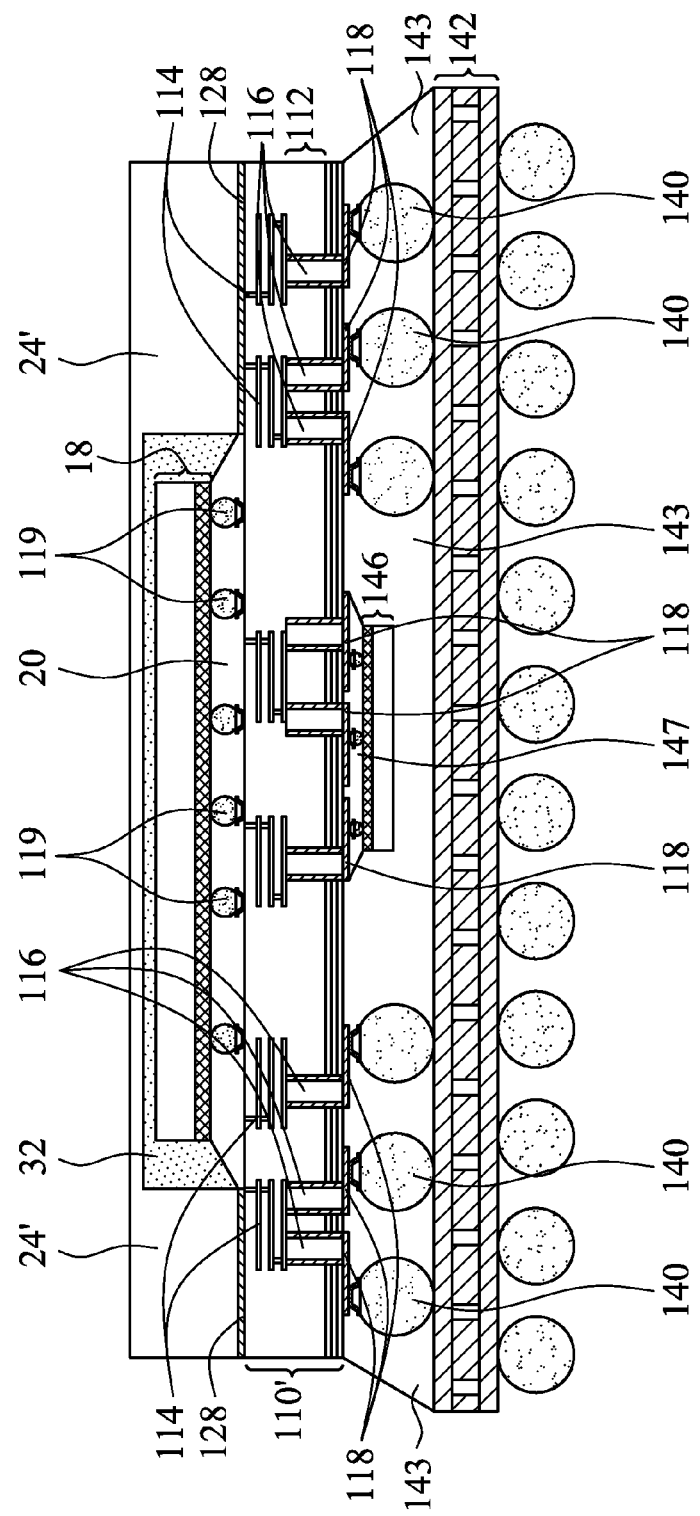
FIGS. 11 through 13 are cross-sectional views and top views of package structures in accordance with yet other embodiments.

FIG. 11 illustrates a package structure in accordance with an alternative embodiment. In this embodiment, top die 18 is bonded to interposer die 110', which may be a discrete die that has already been sawed from a wafer, or a part of un-diced wafer. Underfill 147 is also dispensed. Dummy chip 24' comprises a portion encircling top die 18. In an embodiment, as shown in FIG. 11, dummy chip 24' further comprises a thin layer directly over top die 18. In alternative embodiment, no thin layer of dummy chip 24' is directly over top die 18, and top die 18 is located in a through-opening in dummy chip 24', which through-opening is shown in FIG. 3A as opening 26.

Interposer die 110' is substantially free from integrated circuit devices, including active devices, such as transistors and passive devices, such as capacitors and resistors. In other words, interposer die 110' includes connections, such as metal lines, vias, and bond pads, but is not used to form integrated circuit devices. Interposer die 110' comprises substrate 112, which may be formed of a semiconductor material, such as silicon or a dielectric material. Metal lines and vias 114 are formed in interposer die 110' as redistribution lines (RDLs), wherein RDLs 114 may include a plurality of layers formed in a plurality of dielectric layers. Further, through-substrate vias (TSVs) 116 may be formed in substrate 112.

Interposer die 110' and top die 18 are bonded, for example, through solder bumps 119. Alternatively, direct metal-to-metal bonding may be used. Accordingly, RDLs 114 are electrically connected to the devices in top die 18. Thermally conductive material 32 is filled in the space between top die 18 and dummy chip 24'. Underfill 20 may be filled into the space between top die 18 and interposer die 110' to protect the bonding.

Figure 12A:
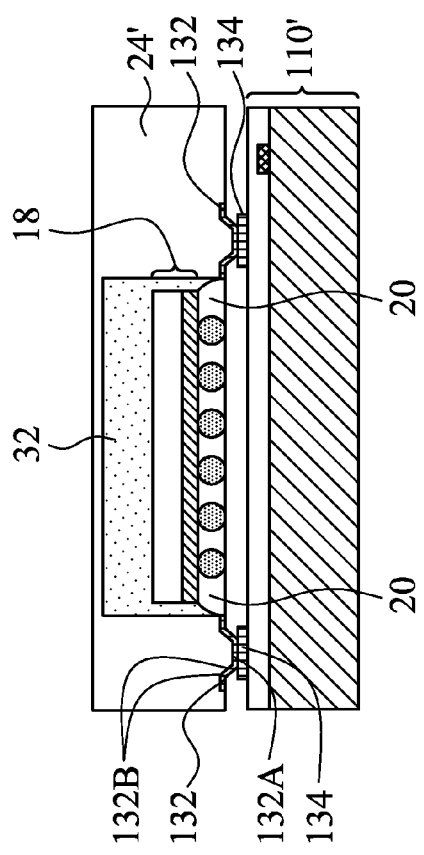
Figure 12C:
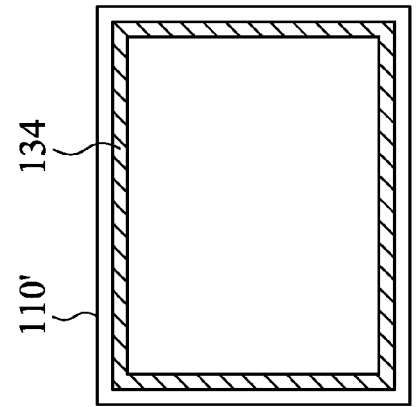
Figure 12B:

Dummy chip 24' is further bonded to interposer die 110'. In an embodiment, adhesive 128 is used to join dummy chip 24' to interposer die 110'. In alternative embodiments, dummy chip 24' and interposer die 110' are bonded through bond pads, which are shown in FIGS. 12A, 12B, and 12C. Referring to FIG. 12B, which is a bottom view of dummy chip 24', bond pad 132 is formed on a surface (the surface facing interposer die 110' in FIGS. 11 and 12A) of dummy chip 24'. In an embodiment, bond pad 132 is formed as a ring, although it may be separated into a plurality of discrete portions aligned as a ring. Bond pad 132 (FIG. 12A) may include portions 132A and 132B, with portion 132A protruding beyond the surface of dummy chip 24' further than portion 132B. Similarly, FIG. 12C illustrates a top view of interposer die 110', wherein bond pad 134 is formed on the surface of interposer die 110'. Although each of FIGS. 12B and 12C only illustrates one bond pad ring 132 and one bond pad ring 134, respectively, more bond pad rings or discrete bond pads may be formed. Bond pads 132 and 134 may be dummy pads that are not electrically connected to any device in top die 18 and die 146.

FIG. 12A illustrates a cross-sectional view of a structure with dummy chip 24' bonded to interposer die 110'. In an embodiment, bond pads 132 and 134 are metal pads, and the bonding may be a direct metal-to-metal bonding. Accordingly, the protruding portion 132A of bond pad 132 is bonded to bond pad 134. In alternative embodiments, a solder (not shown) may be used to bond pads 132 and 134, wherein the solder may be a eutectic solder. In yet other embodiments, bond pads 132 and 134 are formed of oxides and are bonded through oxide-to-oxide bonding. It is appreciated that bond pad 134 may also have the cross-sectional shape as the illustrated bond pad 132 in FIG. 12B, while bond pad 132 may also have the cross-sectional shape as bond pad 134 in FIG. 12C.

Referring back to FIG. 11, RDLs 118 may be formed on the bottom side of substrate 112, and hence RDLs 114 and RDLs 118 are on opposite sides of substrate 112. Although only one layer of RDLs 118 is illustrated, RDLs 118 may include a plurality of layers. Solder bumps 140 are formed on the bottom surface of interposer die 110' and are electrically coupled to TSVs 116, RDLs 114 and 118, and/or top die 18. Further, solder bumps 140 may be used to bond interposer die 110' to an additional electrical component 142, which may be a package substrate, a printed circuit board (PCB), or the like. Underfill 143 may be filled into the space between electrical component 142 and interposer die 110' to protect the bonding.

In an embodiment, die 146 (also referred to as a second-tier die, with top die 18 also referred to as being a first-tier die) is also bonded to interposer die 110', wherein top die 18 and die 146 are on opposite sides of interposer die 110'. Die 146 may also be electrically coupled to top die 18 and solder bumps 140 through the connections in interposer die 110'. Top die 18 and die 146 may be different types of dies. For example, top die 18 may be a logic die, such as a central computing unit (CPU) die, while die 146 may be a memory die. Die 146 may be relatively thin compared to the dimension of solder bumps 140 so that die 146 fits into the space between electrical component 142 and interposer die 110'.

Figure 13:
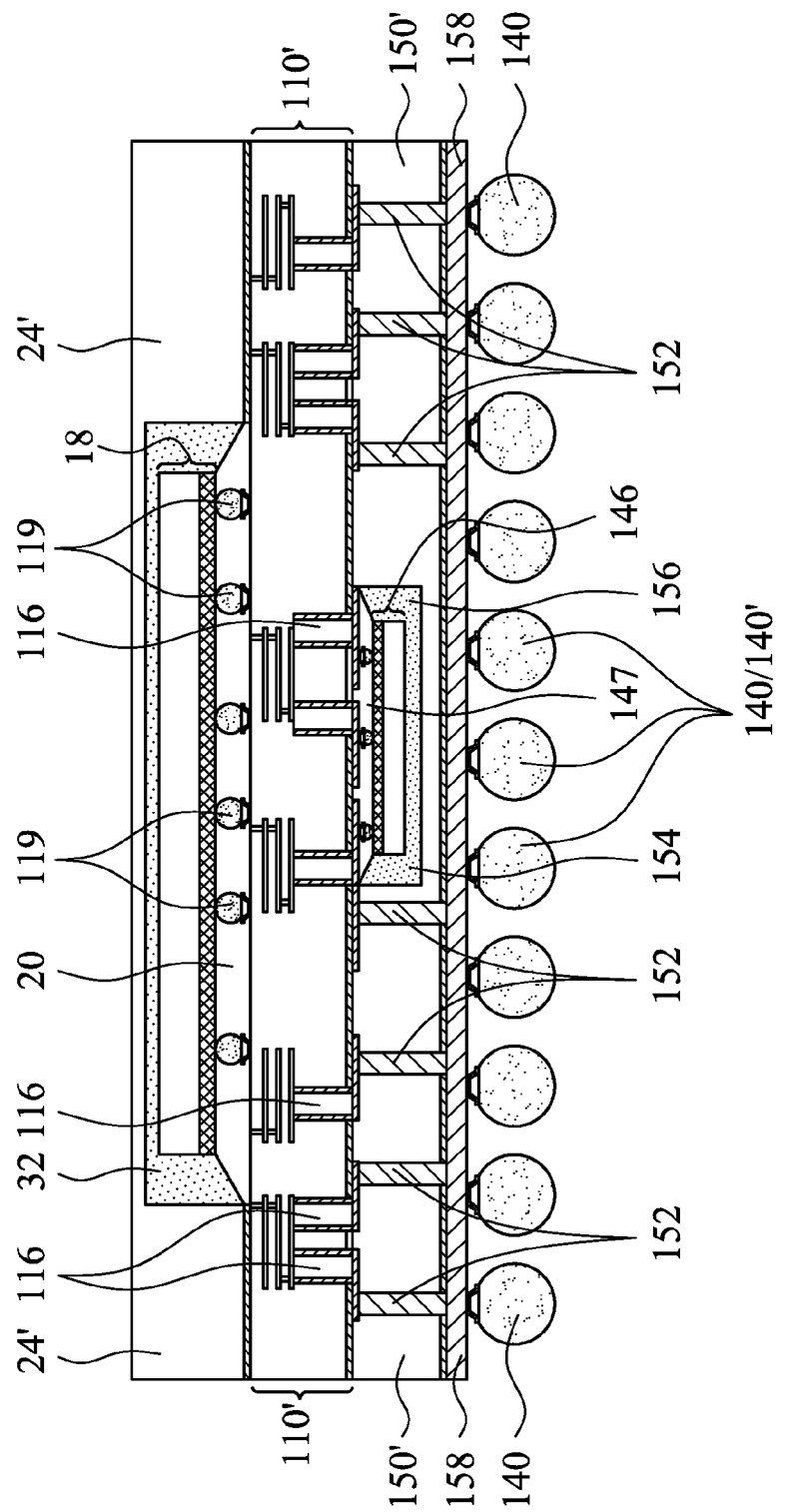

FIG. 13 illustrates yet another embodiment, this embodiment is similar to the embodiment shown in FIG. 11, except an additional dummy chip 150' is bonded to interposer die 110', and is located between interposer die 110' and solder bumps 140. Dummy chip 150' may be formed of silicon or a dielectric material. Again, dummy chip 150' comprises no integrated circuit devices, such as transistors, resistors, and capacitors formed thereon. Electrical connections, such as TSVs 152 are formed in dummy chip 150', and may be electrically connected to die 146 and/or top die 18 through TSVs 116. In this embodiment, dummy chip 150' may include opening 154, in which die 146 and thermally conductive material 156 are located. The process for bonding dummy chip 150' to interposer die 110' may be similar to what is shown in FIGS. 8 through 10 or FIGS. 12A through 12C.

In FIG. 11, due to the existence of die 146, a portion of the bottom surface of interposer die 110' is not available for forming solder bumps 140. In the embodiment shown in FIG. 13, however, more solder bumps 140 may be formed since some of the solder bumps 140 (denoted as 140') may be formed directly under die 146. This may be achieved, for example, by forming one or more layers of RDLs 158 to route connections from solder bumps 140' to TSVs 152.

Figure 14:
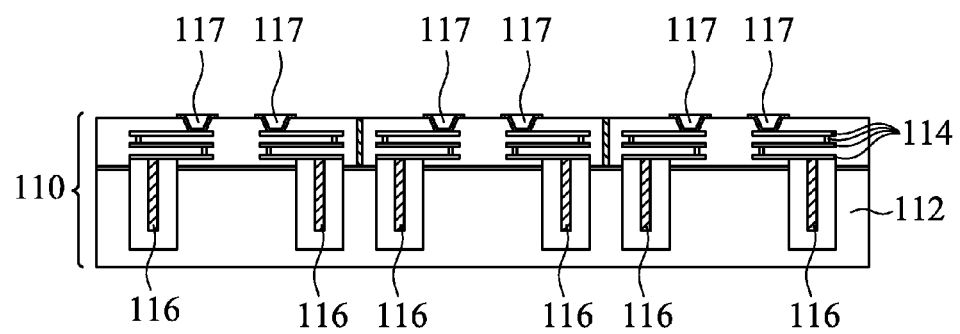
FIGS. 14 through 23 are cross-sectional views of intermediate stages in the manufacturing of the package structures shown in FIGS. 11 and 13.

A brief process flow for forming the structure in FIG. 11 is shown in FIGS. 14 through 22. For simplicity, the details of the structure shown in FIG. 11 may not be shown in FIGS. 14 through 22. Referring to FIG. 14, substrate 112 of interposer wafer 110 is provided, and TSVs 116 are formed in substrate 112. RDLs 114 are then formed over substrate 112 and electrical connected to TSVs 116. Further, bumps or bond pads 117 are formed on the surface of interposer wafer 110, wherein bumps/pads 117 may be solder bumps or metal bumps, such as copper bumps, which may further be covered by a nickel layer (not shown). Bond pad 134 (not shown), as shown in FIGS. 12A and 12C, may also be formed on the surface of interposer wafer 110.

Figure 15:
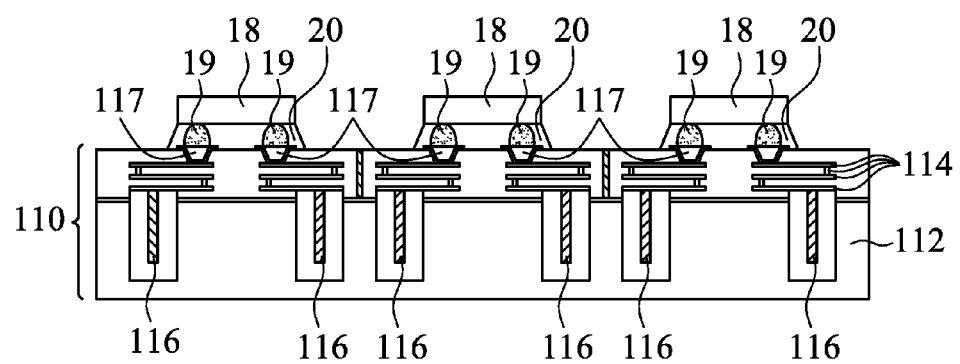
Figure 16:
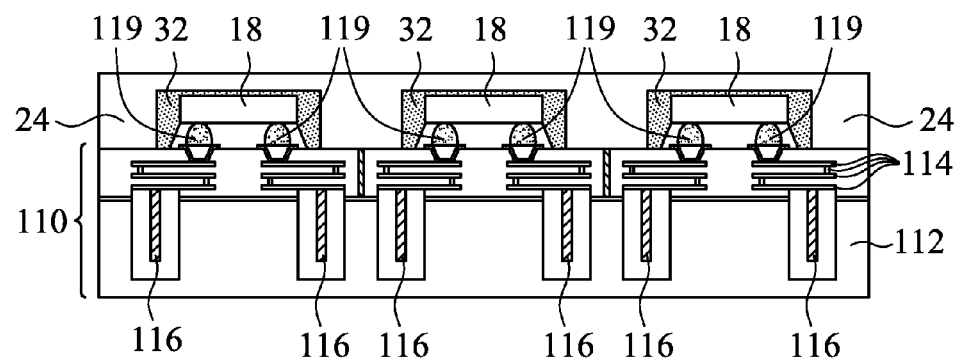

Next, as shown in FIG. 15, top dies 18 are bonded to interposer wafer 110, followed by applying underfill 20. Dummy wafer 24 (not shown) is then bonded to interposer wafer 110, as shown in FIG. 16. The openings in dummy wafer 24 are used to host top dies 18, and may be filled with a suitable amount of thermally conductive material 32. Alternatively, the openings may be through-openings similar to openings 26 in FIGS. 3A and 3B. The bonding of dummy wafer 24 to interposer wafer 110 is essentially the same as bonding dummy wafer 24 to bottom wafer 10 (FIGS. 1 through 10), and hence is not discussed in detail herein. Further, the bonding methods may include the scheme shown in FIGS. 12A through 12C.

Figure 17:
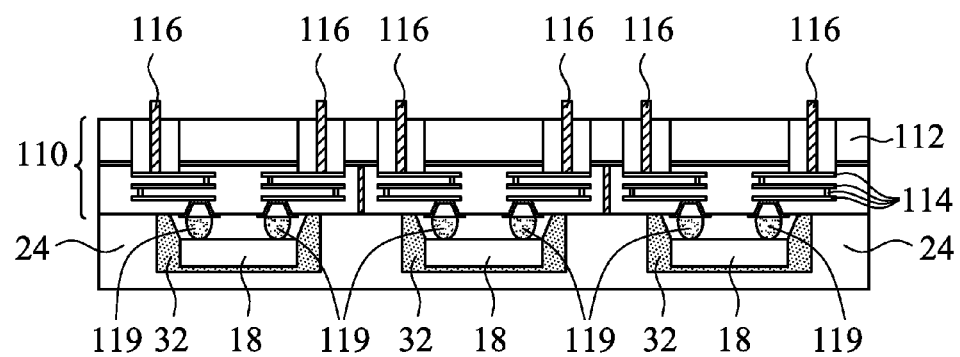
Figure 18:
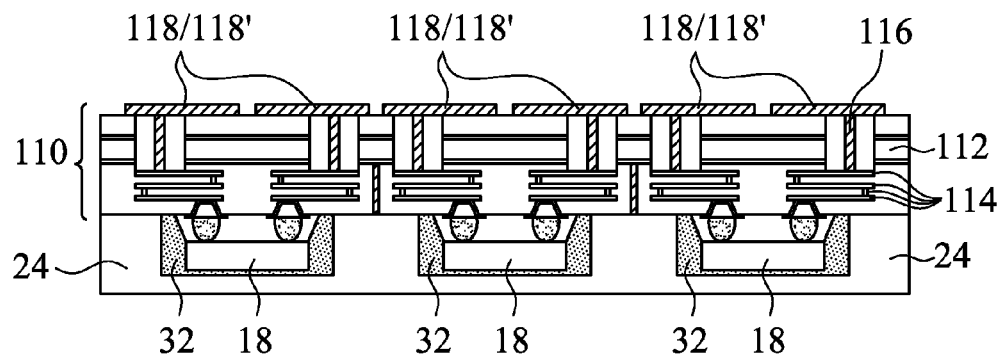
Figure 19:
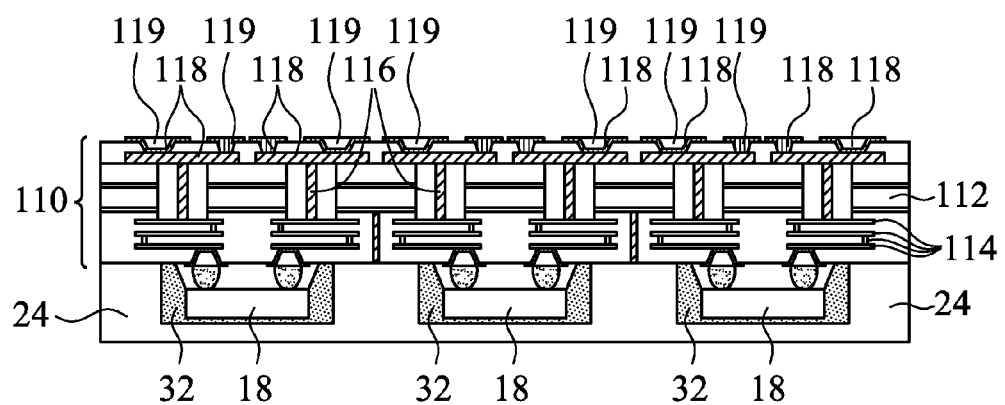

Referring to FIG. 17, the structure shown in FIG. 16 is flipped upside down and a thinning (grinding) is performed to substrate 112 so that TSVs 116 are exposed. FIGS. 18 and 19 illustrate the formation of RDLs 118 (which include metal pads 118') and bumps/pads 119 (FIG. 19). As is known in the art, the formation of RDLs 118 and bumps/pads 119 may include forming metal pads, forming a dielectric layer, such as polyimide layer over the metal pads (not shown), forming openings in the dielectric layer (not shown) to expose the metal pads, forming under-bump metallurgy (not shown) in the openings and contacting the metal pads, and forming bumps/pads 119 on the UBMs. Again, as is known in the art, bumps/pads 119 may be solder bumps or other types of metal bumps, such as copper bumps, wherein a nickel layer may be formed to cover the copper bumps.

Figure 20:
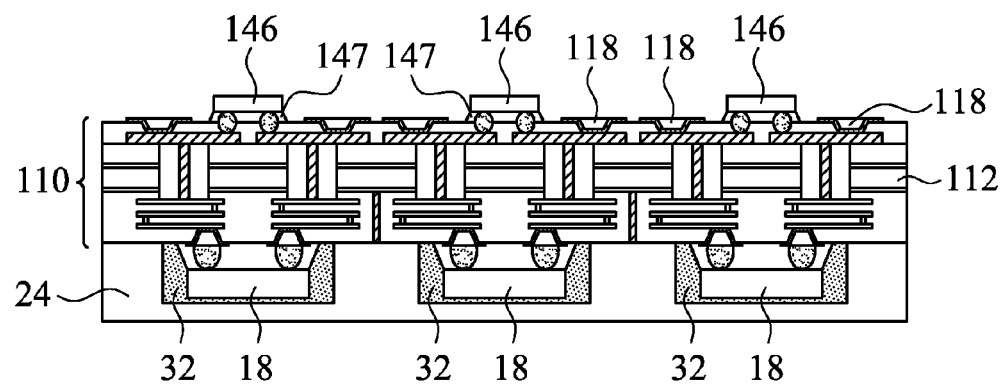

In FIG. 20, dies 146 are bonded to interposer wafer 110, and underfill 147 is also applied into the space between dies 146 and interposer wafer 110. Solder bumps 140 are then formed on bumps/pads 119, as shown in FIG. 21.

Figure 21:
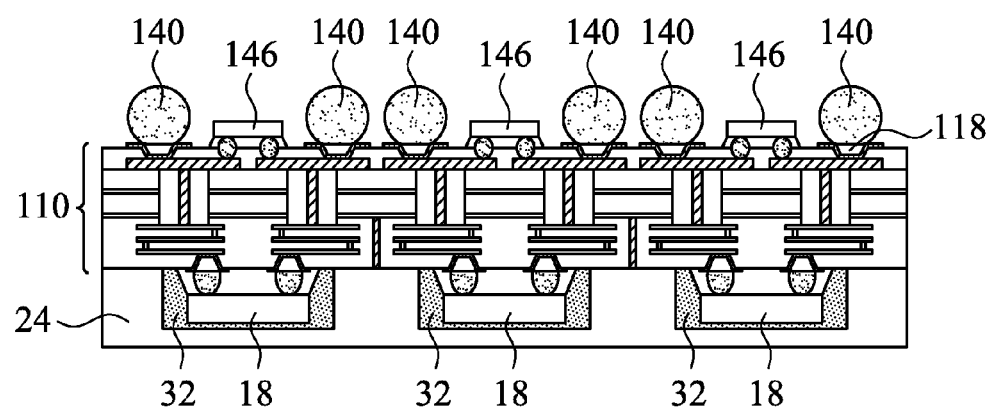
Figure 22:
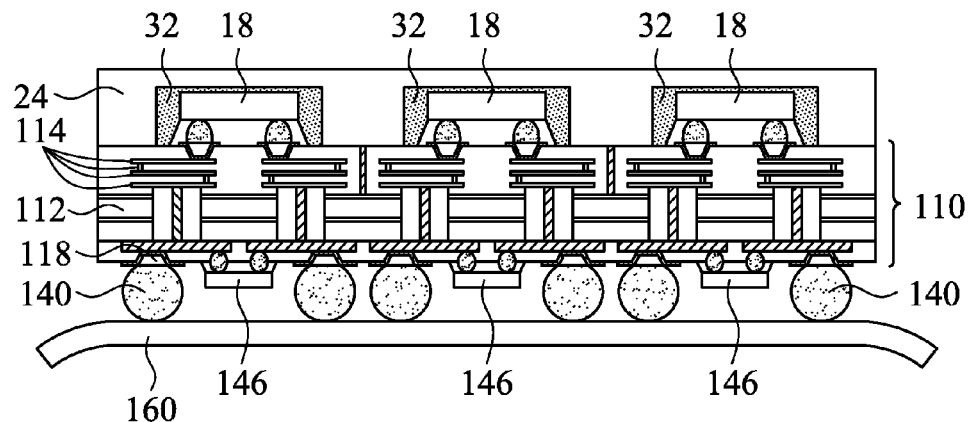

Referring to FIG. 22, the structure shown in FIG. 21 is taped, for example, by adhering blue tape 160 to solder bumps 140. In an embodiment, dummy wafer 24 is grinded from the top surface to a suitable thickness, and thermally conductive material 32 may, or may not, be exposed after the step of grinding. In alternative embodiments, no grinding is performed. The resulting structure may then be diced, with each of the resulting dies (refer to FIG. 11) including interposer die 110' as a resulting portion of interposer wafer 110, dummy chip 24' as a resulting portion of dummy wafer 24, top die 18, and possibly die 146.

Figure 23:
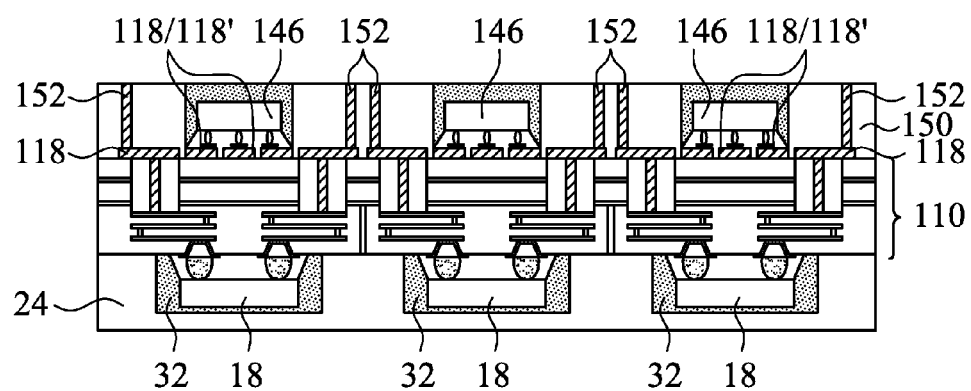

The process steps for forming the structure shown in FIG. 13 are similar to the embodiment shown in FIGS. 14 through 22. The initial steps are essentially the same as shown in FIGS. 14 through 18. After the formation of the structure shown in FIG. 18, dummy wafer 150 (with dummy chip 150' being part of diced dummy wafer 150) may be bonded to interposer wafer 110. TSVs 152 are then formed in dummy wafer 150 and electrically coupled to bond pads 118. The resulting structure is shown in FIG. 23. Dummy wafer 150 comprises openings for accommodating dies 146. The formation of the remaining RDLs 158 and solder bumps 140 (FIG. 13) are essentially the same as shown in FIGS. 21 and 22, and hence are not repeated herein.

It is observed that dummy wafer 24 has a good thermal conductivity, and hence the heat generated in bottom chip 10' and top die 18 (FIG. 6A) may be easily dissipated. Further, when dummy wafer 24 is formed of silicon, the coefficient of thermal expansion (CTE) of dummy wafer 24 may be the same as that of the substrates in bottom chip 10' and top die 18, resulting in a low stress in the resulting 3DIC structure. Furthermore, with a planar surface of the 3DIC structure, as a result of dummy wafer 24, top dies 18, and possibly thermally conductive material 32, the likelihood of breakage of bottom wafer 10 is reduced, even if bottom wafer 10 is thin.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure comprising:
    a first die;
    a second die over and bonded to the first die, wherein the second die has a size smaller than a size of the first die;
    a dummy chip over the first die, wherein the dummy chip comprises a portion encircling the second die, wherein the dummy chip comprises a material selected from the group consisting essentially of silicon and a metal, wherein the dummy chip comprises an opening extending from a bottom surface to an intermediate level of the dummy chip, wherein a portion of the dummy chip covers the opening, and wherein the second die extends into the opening;
    an adhesive adhering the dummy chip to the first die;
    metal pillars extending from a top surface to a bottom surface of the dummy chip;
    a gap in the opening and horizontally between a sidewall of the second die and a sidewall of the dummy chip; and
    a thermally conductive material horizontally between and contacting the dummy chip and the second die, wherein the thermally conductive material is in physical contact with the sidewall of the second die and the sidewall of the dummy chip.

2. The package structure of claim 1, wherein the dummy chip is a dummy silicon chip.

3. The package structure of claim 1, wherein the first die is an interposer die substantially free from active devices.

4. The package structure of claim 3 further comprising a third die bonded to the interposer die, wherein the second die and the third die are on opposite sides of the interposer die.

5. The package structure of claim 4 further comprising solder bumps on a surface of the interposer die, wherein the solder bumps and the third die are on a same side of the interposer die.

6. The package structure of claim 4 further comprising a dummy silicon die bonded to the interposer die, wherein the dummy silicon die and the second die are on opposite sides of the interposer die, and wherein the dummy silicon die comprises an opening, with the third die being in the opening.

7. The package structure of claim 6 further comprising solder bumps on a side of the dummy silicon die and electrically connected to through-silicon vias in the dummy silicon die, wherein the interposer die and the solder bumps are on opposite sides of the dummy silicon die.

8. The package structure of claim 1, wherein the first die comprises active devices.

9. The package structure of claim 1, wherein the dummy chip is a dummy metal chip.

10. The package structure of claim 1, wherein the dummy chip comprises an opening extending from a top surface to a bottom surface of the dummy chip, with the second die extending into the opening.

11. The package structure of claim 1, wherein the thermally conductive material forms a ring encircling the second die.

* * * * *